US011796556B2

(12) United States Patent
Yu

(10) Patent No.: US 11,796,556 B2
(45) Date of Patent: Oct. 24, 2023

(54) SPEED SENSOR ASSEMBLY

(71) Applicant: Suzhou Littelfuse OVS Co., Ltd., Suzhou (CN)

(72) Inventor: Jiao Yu, Suzhou (CN)

(73) Assignee: Suzhou Littelfuse OVS Co., Ltd., Suzhou (CN)

( * ) Notice: Subject to any disclaimer, the term of this patent is extended or adjusted under 35 U.S.C. 154(b) by 275 days.

(21) Appl. No.: 17/276,905

(22) PCT Filed: Sep. 19, 2018

(86) PCT No.: PCT/CN2018/106459
§ 371 (c)(1),
(2) Date: Mar. 17, 2021

(87) PCT Pub. No.: WO2020/056618
PCT Pub. Date: Mar. 26, 2020

(65) Prior Publication Data
US 2021/0356490 A1 Nov. 18, 2021

(51) Int. Cl.
*G01P 3/488* (2006.01)
*G01P 1/02* (2006.01)
*H05K 3/30* (2006.01)

(52) U.S. Cl.
CPC .............. *G01P 3/488* (2013.01); *G01P 1/026* (2013.01); *H05K 3/301* (2013.01); *H05K 2201/10151* (2013.01)

(58) Field of Classification Search
CPC ......... G01P 3/488; G01P 1/026; H05K 3/301; H05K 2201/10151

(Continued)

(56) References Cited

U.S. PATENT DOCUMENTS 4,893,075 A * 1/1990 Dierker, Jr. ............. G01P 3/488
324/225
4,935,698 A * 6/1990 Kawaji .................... G01B 7/14
324/207.2
4,937,522 A 6/1990 Gee
(Continued)

FOREIGN PATENT DOCUMENTS

CN 101681894 A 3/2010
CN 102156197 A 8/2011
(Continued)

OTHER PUBLICATIONS

International Search Report and Written Opinion dated Jul. 3, 2019 for PCT application PCT/CN2018/106459 filed Sep. 19, 2018.
(Continued)

*Primary Examiner* — Jermele M Hollington
*Assistant Examiner* — Robert P Alejnikov, Jr.
(74) *Attorney, Agent, or Firm* — KDW Firm PLLC

(57) ABSTRACT

A speed sensor assembly (114) includes a printed circuit board (PCB) (120) having a first main side and a second main side, a magnet (116) directly coupled to the first main side of the PCB (120), a sensor (118) electrically connected to the PCB (120), and a pole piece (125) directly coupled to the magnet (116) and to the sensor (118), wherein the magnet (116) includes a slot partially enclosed by the pole piece (125). The speed sensor assembly (114) including a slotted magnet (116) to reduce magnetic field amplitude for single sensing element hall effect sensor applications. The speed sensor assemblies (114) operate with both minimum and maximum air gaps.

12 Claims, 6 Drawing Sheets

(58) Field of Classification Search
USPC .......................................................... 324/174
See application file for complete search history.

(56) References Cited

U.S. PATENT DOCUMENTS

| | | | | |
|---|---|---|---|---|
| 5,321,355 A * | 6/1994 | Luetzow | ............ | H03K 17/9517 |
| | | | | 324/207.2 |
| 5,581,179 A * | 12/1996 | Engel | ..................... | G01D 5/147 |
| | | | | 174/559 |
| 5,963,028 A * | 10/1999 | Engel | ..................... | G01R 33/07 |
| | | | | 174/536 |
| 2005/0168210 A1* | 8/2005 | Kaneda | .................... | H05K 1/18 |
| | | | | 324/117 R |
| 2006/0038560 A1 | 2/2006 | Kurumado | | |
| 2008/0116884 A1* | 5/2008 | Rettig | .................... | G01D 5/147 |
| | | | | 324/207.21 |
| 2014/0103915 A1* | 4/2014 | Satz | .................. | G01R 33/0011 |
| | | | | 324/207.25 |

FOREIGN PATENT DOCUMENTS

| | | | | |
|---|---|---|---|---|
| CN | 202383150 U | 8/2012 | | |
| CN | 102788997 A | 11/2012 | | |
| CN | 102809665 A | 12/2012 | | |
| CN | 205909785 U | 1/2017 | | |
| DE | 2004002348 U1 | 4/2004 | | |
| DE | 2004063539 A1 | 9/2005 | | |
| JP | H08205506 A | 8/1996 | | |
| JP | 2003084007 A | 3/2003 | | |
| WO | WO-2009015990 A2 * | 2/2009 | ......... | B29C 45/1671 |
| WO | 2018023693 A1 | 2/2018 | | |

OTHER PUBLICATIONS

Supplementary European Search Report dated Aug. 16, 2021 for European Patent Publication No. 3853618.

* cited by examiner

SPEED SENSOR ASSEMBLY

BACKGROUND OF THE DISCLOSURE

Field of the Disclosure

The present disclosure relates to a sensor for measuring output speed and, in particular, to an output speed sensor assembly having a slotted magnet.

Discussion of Related Art

Output speed sensors provide one or more independent frequency outputs to indicate output speed of a sensed, ferrous target. One type of output speed sensor includes a magnet having a cylindrical or rectangular shape, the magnet facing a back side of the hall element, which senses the rotating target gear. However, current sensors with solid, cylindrical or rectangular shape magnet designs can't meet minimum and maximum air gap requirements. More specifically, solid, cylindrical or rectangular shape magnet designs can't increase significant signal amplitude, even by increasing the magnet length or magnet grade. Thus, it would be desirable to provide an output speed sensor assembly that overcomes one or more deficiencies of the prior art.

SUMMARY OF THE DISCLOSURE

This Summary is provided to introduce a selection of concepts in a simplified form that are further described below in the Detailed Description. This Summary is not intended to identify key features or essential features of the claimed subject matter, nor is it intended as an aid in determining the scope of the claimed subject matter.

In one or more embodiments, a speed sensor assembly may include a printed circuit board (PCB), and a magnet directly coupled to the PCB. The speed sensor assembly may further include a sensor electrically connected to the PCB, and a pole piece coupled between the magnet and the sensor, wherein the magnet includes a slot partially enclosed by the pole piece.

In one or more embodiments, a speed sensor assembly may a printed circuit board (PCB) having a first main side and a second main side, and a magnet directly coupled to the first main side of the PCB. The speed sensor assembly may include a sensor electrically connected to the PCB, and a pole piece between the magnet and the sensor, wherein the magnet includes a slot along an end surface, and wherein the pole piece is directly coupled to the end surface.

In one or more embodiments, a method of reducing a magnetic field amplitude in a speed sensor assembly may include providing a printed circuit board (PCB), and directly coupling a magnet to the PCB. The method may further include electrically connecting a sensor to the PCB, positioning a pole piece between the magnet and the sensor, and providing a slot along an end surface of the magnet to reduce a magnetic field amplitude of magnet and the pole piece, wherein the pole piece is directly coupled to the end surface.

BRIEF DESCRIPTION OF THE DRAWINGS

The accompanying drawings illustrate exemplary approaches of the disclosed output speed sensor assembly so far devised for the practical application of the principles thereof, and in which.

Figure 1:
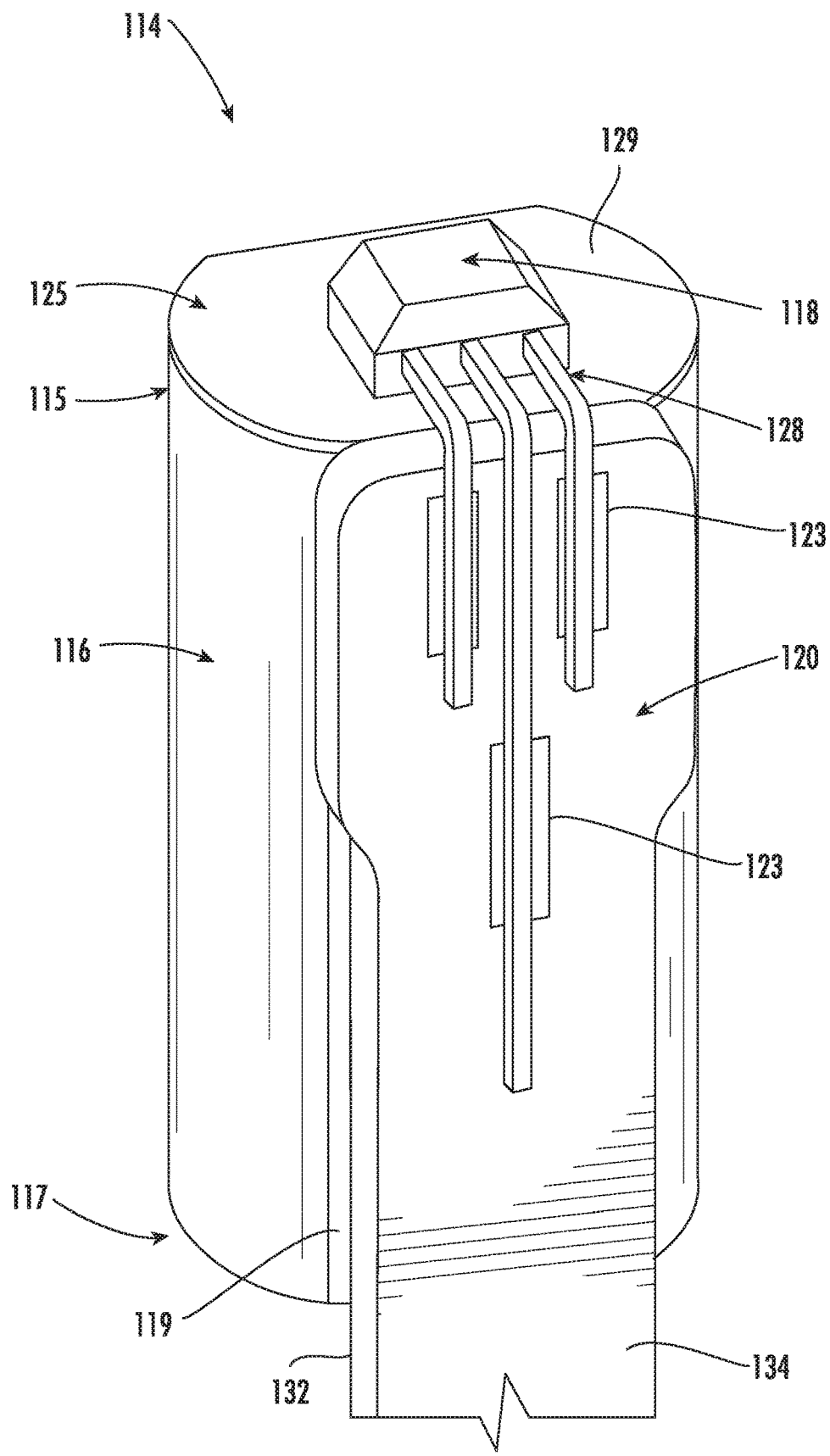
FIG. 1 is a perspective view of a speed sensor assembly according to exemplary embodiments of the disclosure.

The drawings are not necessarily to scale. The drawings are merely representations, not intended to portray specific parameters of the disclosure. Furthermore, the drawings are intended to depict exemplary embodiments of the disclosure, and therefore is not considered as limiting in scope.

Furthermore, certain elements in some of the figures may be omitted, or illustrated not-to-scale, for illustrative clarity. The cross-sectional views may be in the form of "slices", or "near-sighted" cross-sectional views, omitting certain background lines otherwise visible in a "true" cross-sectional view, for illustrative clarity. Furthermore, for clarity, some reference numbers may be omitted in certain drawings.

DETAILED DESCRIPTION

The present disclosure will now proceed with reference to the accompanying drawings, in which various approaches are shown. It will be appreciated, however, that the speed sensor assembly may be embodied in many different forms and should not be construed as limited to the approaches set forth herein. Rather, these approaches are provided so that this disclosure will be thorough and complete, and will fully convey the scope of the disclosure to those skilled in the art. In the drawings, like numbers refer to like elements throughout.

The present embodiments address at least some of the above identified deficiencies of the prior art by providing a single hall element that solves the signal issue under minimum and maximum air gap. Furthermore, to avoid the issue of a hall chip failing to work under minimum air gap, for example, due to saturation of the hall chip by a strong magnetic field, a magnet with a slot can be provided to reduce the magnetic field, and thus meet the hall chip effect.

Although not limited to a single application, the sensor assembly described herein may be used to detect a gear or target wheel in a vehicle transmission, and to generate an electric digital signal proportional to the speed. The transmission controls use this information to modify various transmission functions such as shift points, and to perform diagnostic tests.

As disclosed, embodiments herein provide a runway shaped magnet having a large volume. By coupling the magnet with an additional pole piece, the magnetic field is reduced. When the target wheel is close to the hall chip, the magnetic field amplitude exceeds 500 mT. In conventional designs, the hall chip won't operate correctly under these conditions. However, in the present embodiments, a slot is provided through the magnet, beneath the pole piece. The slotted magnet helps reduce the magnetic field amplitude. As a result, the sensor assembly can meet the magnetic field and peak to peak value requirement for hall chip applications, and also can work with both minimum and maximum air gaps. In some embodiments, the magnet does not include a slot proved therethrough.

Referring now to FIG. 1, an output speed sensor assembly (hereinafter "sensor assembly") 114 according to embodiments of the disclosure will be described. The sensor assembly 114 may be a Hall effect sensor, which is disposed within a housing (not shown). As shown, the sensor assembly 114 may include a magnet 116 and a sensor 118, such as a Hall effect sensor including a Hall chip. Between the hall chip 118 and the magnet 116 is a pole piece 125. In this non-limiting embodiment, the magnet 116 may include a first end 115, a second end 117 opposite the first end 115, a first side 119 extending between the first and second sides 115 and 117, and a second side 121 (FIG. 2) opposite the first side 119. As shown, the first and second sides 119, 121 may be defined by generally flat surfaces parallel to one another. The magnet 116 may be a permanent magnet.

The hall chip 118 may be directly coupled to the pole piece 125, which operates to reduce or counteract the magnetic field. The pole piece 125 localizes the magnetic field in proximity to a sensitive Hall-plate of the hall chip 118. The pole piece 125 may employ a pole-piece material 129 such as a ferromagnetic material (e.g., carbon steel) capable of attracting the magnetic field distribution. As the magnet 116 is moved, its magnetic field distribution is changed. The pole piece 125, working as a reducer of the magnetic field, improves the shape of and guides the flux field generated by the magnet 116 to ensure that the magnetic field strength is appropriate for the hall chip 118. Thus, the hall chip 118 is made more robust and accurate over a wider range when combined with the pole piece 125.

The sensor assembly 114 may be coupled to a PCB 120, which may then positioned within a housing. In some embodiments, the hall chip 118 of the sensor assembly 114 may be physically and electrically coupled to the PCB 120, for example, by set of wire lines 128, or PCB traces, which may provide input/output therebetween. The PCB 120 also includes pads 123 for pasting the components and the hall chip 118. As shown, the PCB 120 has a first main side 132 and a second main side 134, wherein the magnet 116 is directly coupled to the first main side 132. The PCB 120 may be a rigid or flexible PCB. Although not shown, the PCB 120 may further include coupled there to an output signal wire, a power line, and a ground line. In some embodiments, the PCB 120 may include a series of small rigid printed circuit boards, which may be interconnected using the PCB 120 and/or wiring.

As indicated above, in some embodiments, the hall chip 118 and the magnet 116 operate as a Hall effect sensor. That is, the hall chip 118 (e.g., a Hall chip) and the magnet 116 are arranged or operated in such a manner as to develop a non-uniform magnetic field (e.g., the magnetic field varies in a periodic manner), and this magnetic field variation will produce a corresponding variation in the potential difference that is induced in the conductors according to the Hall-effect. The hall chip 118 can detect variations in the magnetic field experienced by the individual sensing elements of the hall chip 118 (e.g., current-carrying conductor) and can be constructed based upon this Hall-effect phenomenon. In one embodiment, using the Hall-effect, the hall chip 118 and the magnet 116 assist to detect a gear or target wheel in the transmission and to generate a electric digital signal proportional to the speed of rotation. The transmission may control use of this information to modify the various transmission functions, such as shift points, and to perform diagnostic tests.

Figure 2:
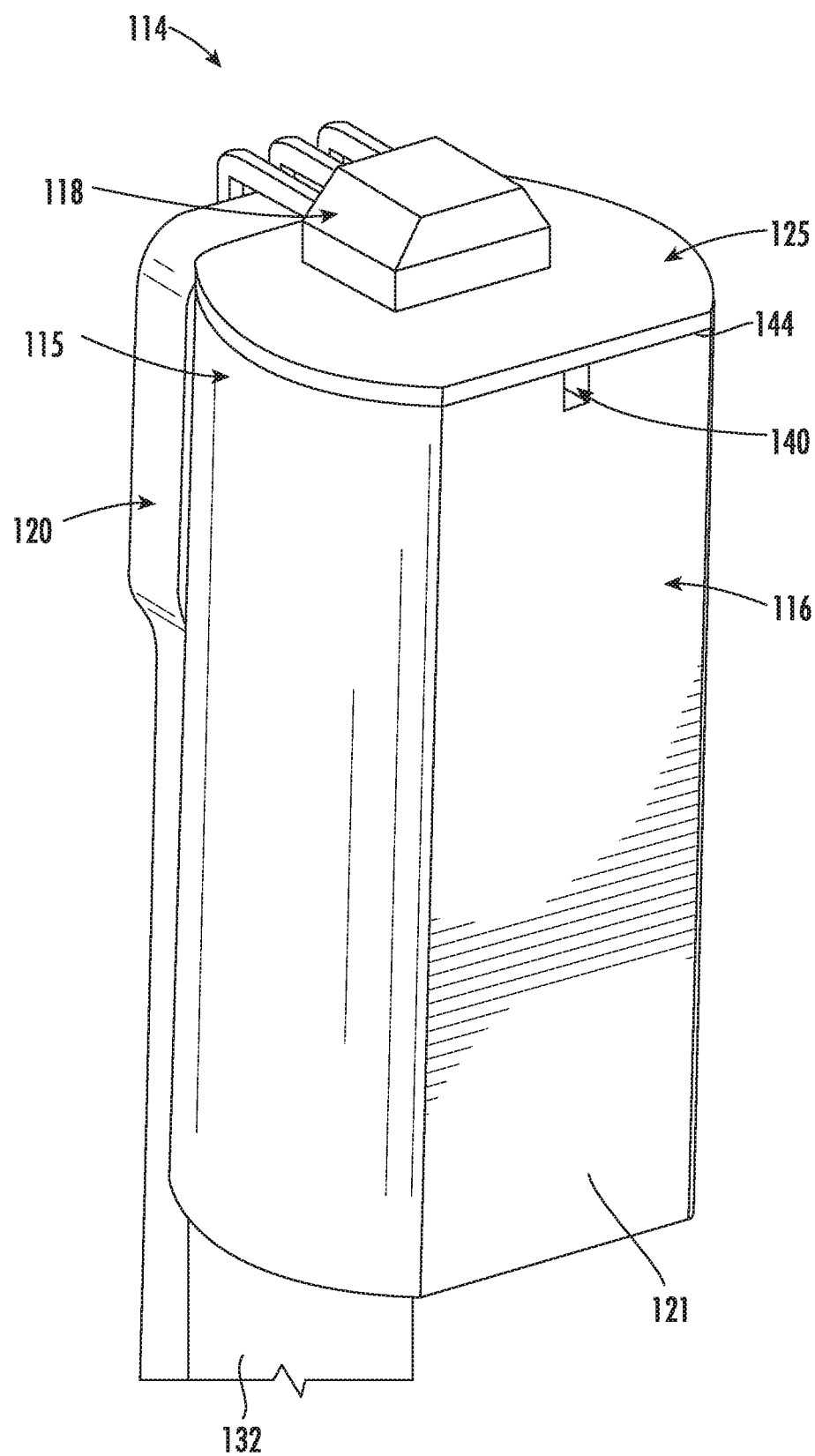
FIG. 2 is a perspective view of the speed sensor assembly of FIG. 1 according to exemplary embodiments of the disclosure.
Figure 3:
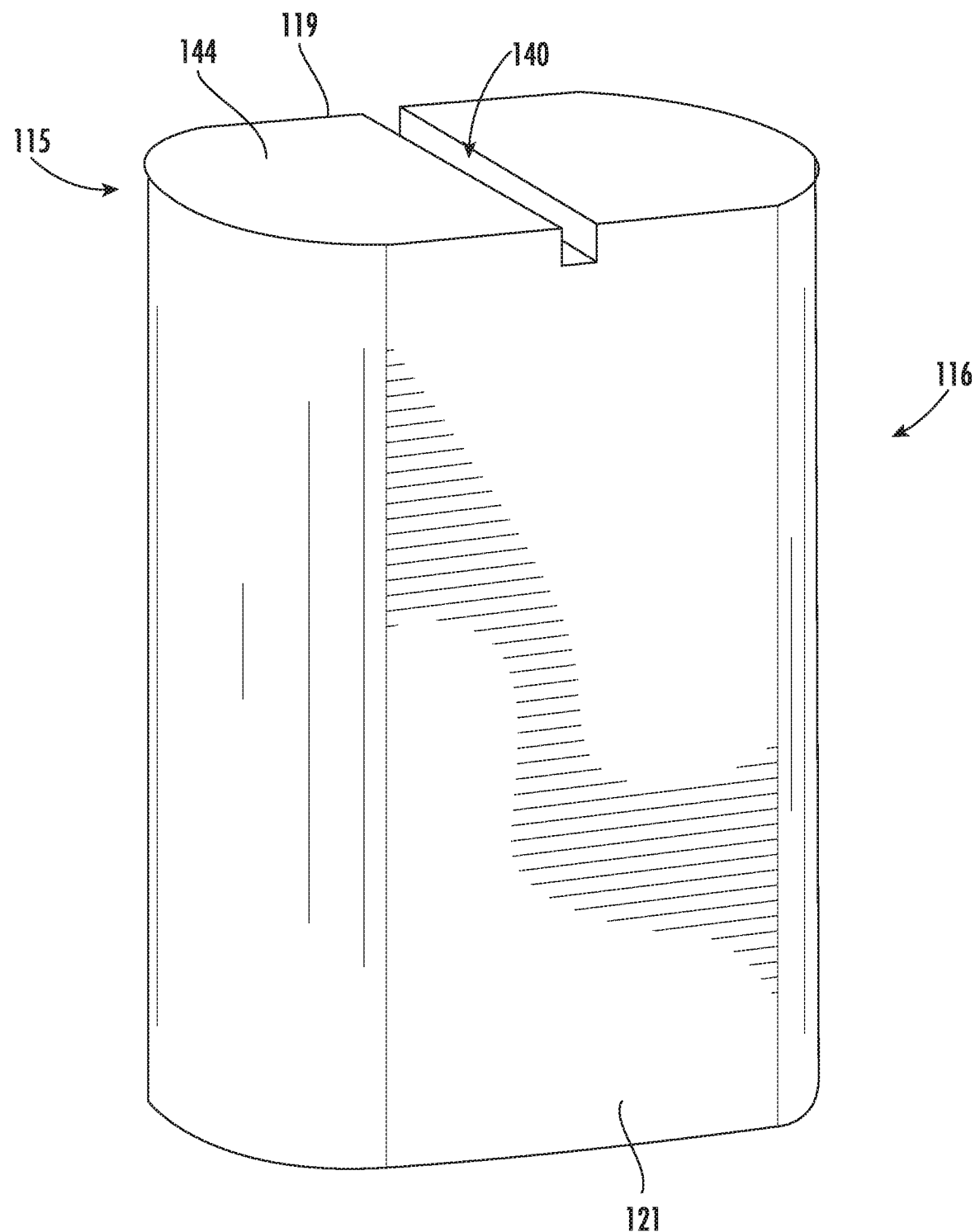
FIG. 3 is a perspective view of a magnet of the speed sensor assembly of FIG. 1 according to exemplary embodiments of the disclosure.

Turning now to FIGS. 2-3, the sensor assembly 114 according to embodiments of the present disclosure will be described in greater detail. As shown, the magnet 116 may include a slot 140 partially enclosed, e.g., along a top, by the pole piece 125. In some embodiments, the slot 140 is a channel recessed into an end surface 144 at the first end 115 of the magnet 116. The slot 140 may extend between the first side 119 and the second side 121 of the magnet 116. As shown in FIG. 2, the pole piece 125 is directly coupled to the end surface 144 of the magnet 116 to form a cover or upper wall of the slot 140. In some embodiments, the pole piece 125 is oriented parallel to a plane defined by the end surface 144. Furthermore, in some embodiments, the slot 140 may be slightly off-center from the position shown. Still furthermore, in some embodiments, more than one slot 140 may be present.

Figure 4:
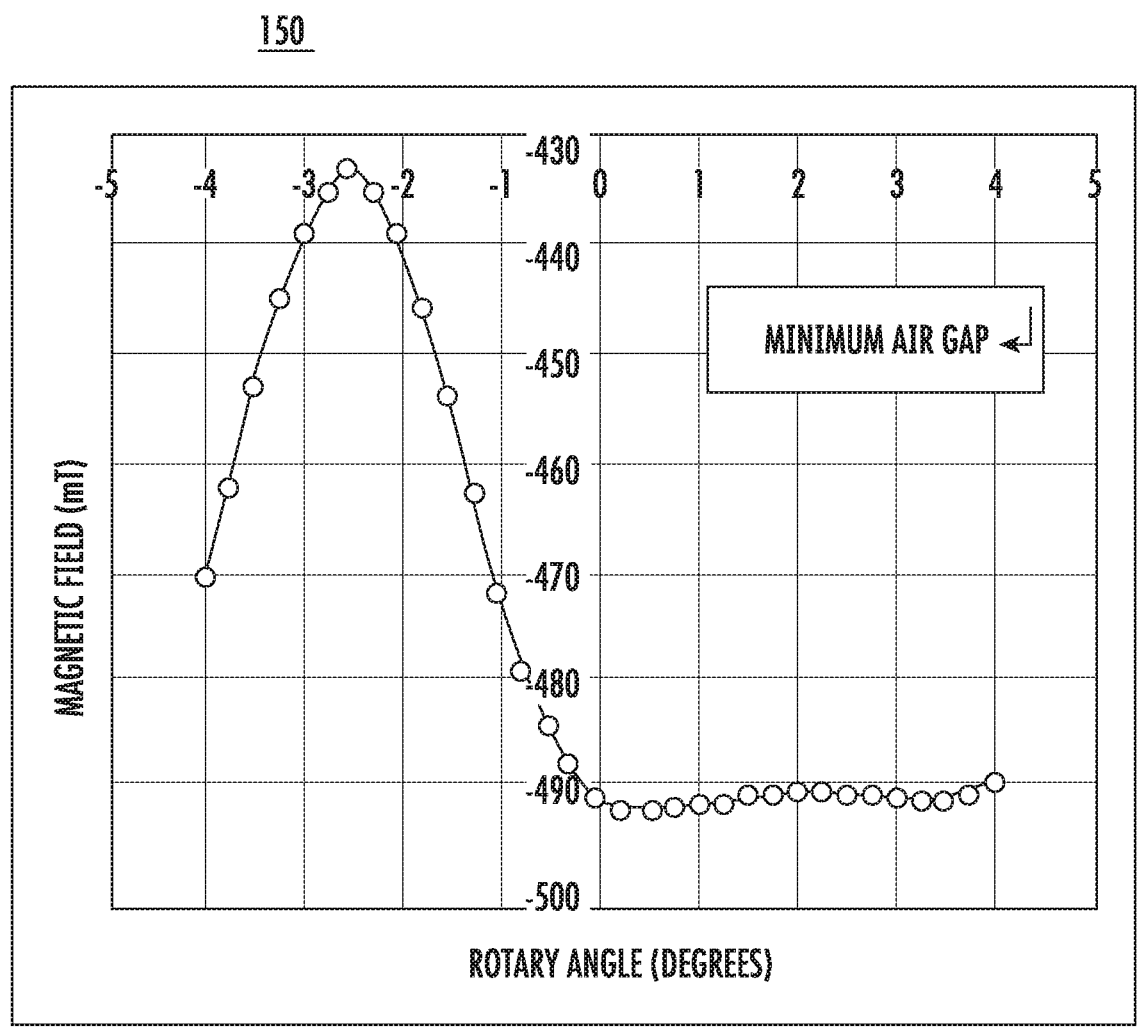
FIG. 4 is a graph illustrating magnetic field vs. rotary angle for a minimum air gap according to exemplary embodiments of the disclosure.
Figure 5:
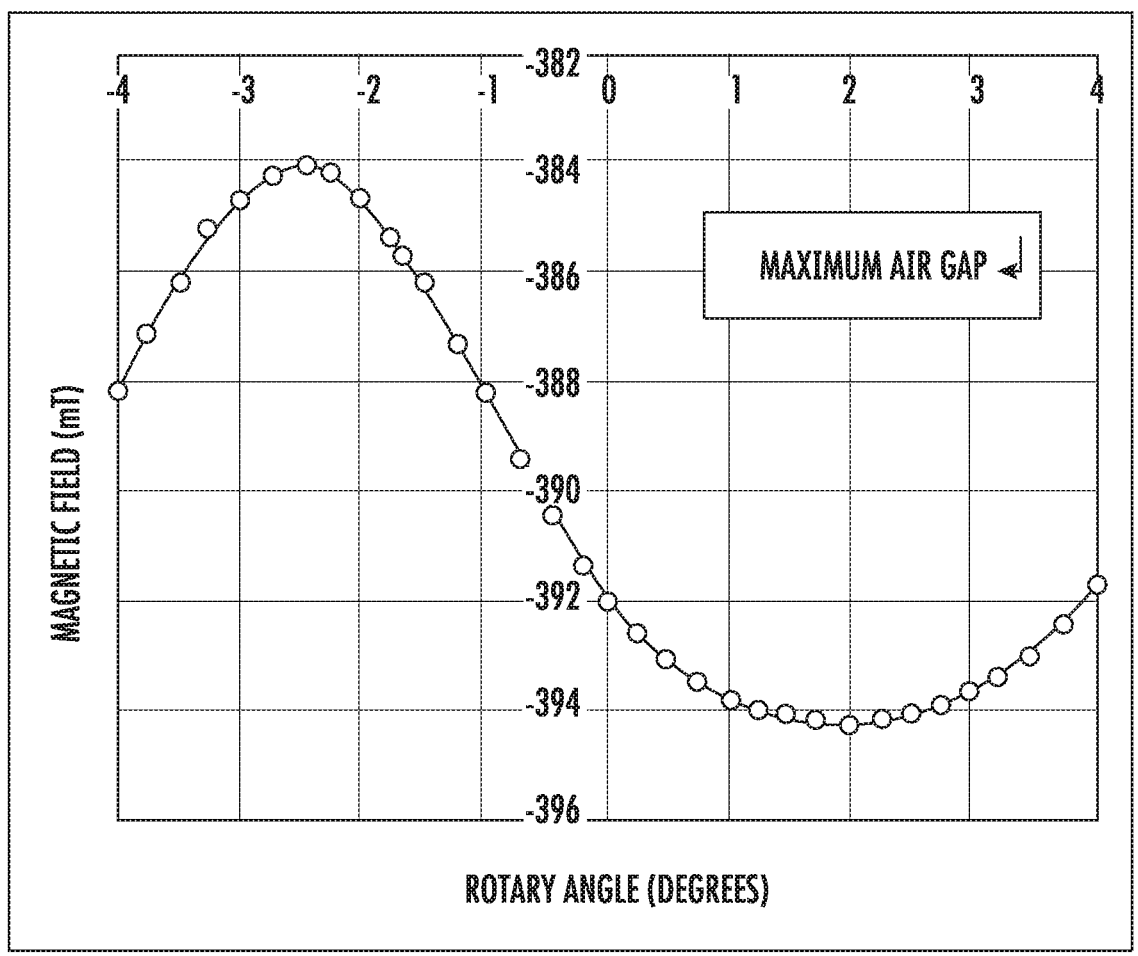
FIG. 5 is a graph illustrating magnetic field vs. rotary angle for a maximum air gap according to exemplary embodiments of the disclosure.

By providing a slot in the magnet 116, beneath the pole piece 125 and the hall chip 118, the magnetic field amplitude is reduced. The sensor assembly 114 therefore still satisfies the magnetic field and peak to peak value requirement for Hall-effect sensor applications, and can also work with both minimum and maximum air gap. For example, FIG. 4 is a graph 150 illustrating minimum air gap with the slotted magnet 116, and FIG. 5 is a graph 155 illustrating maximum air gap with the slotted magnet 116. The runway-type magnet 116 with the slot 140 formed therein has very strong magnetic capabilities, but will not cause so big of a magnetic field, thus allowing it to work in small air gap applications and larger air gap applications. For example, the sensor assembly 114 of the present disclosure may permit a bias magnet from 50 mT to 500 mT, with a peak to peak value exceeding 10 mT.

Figure 6:
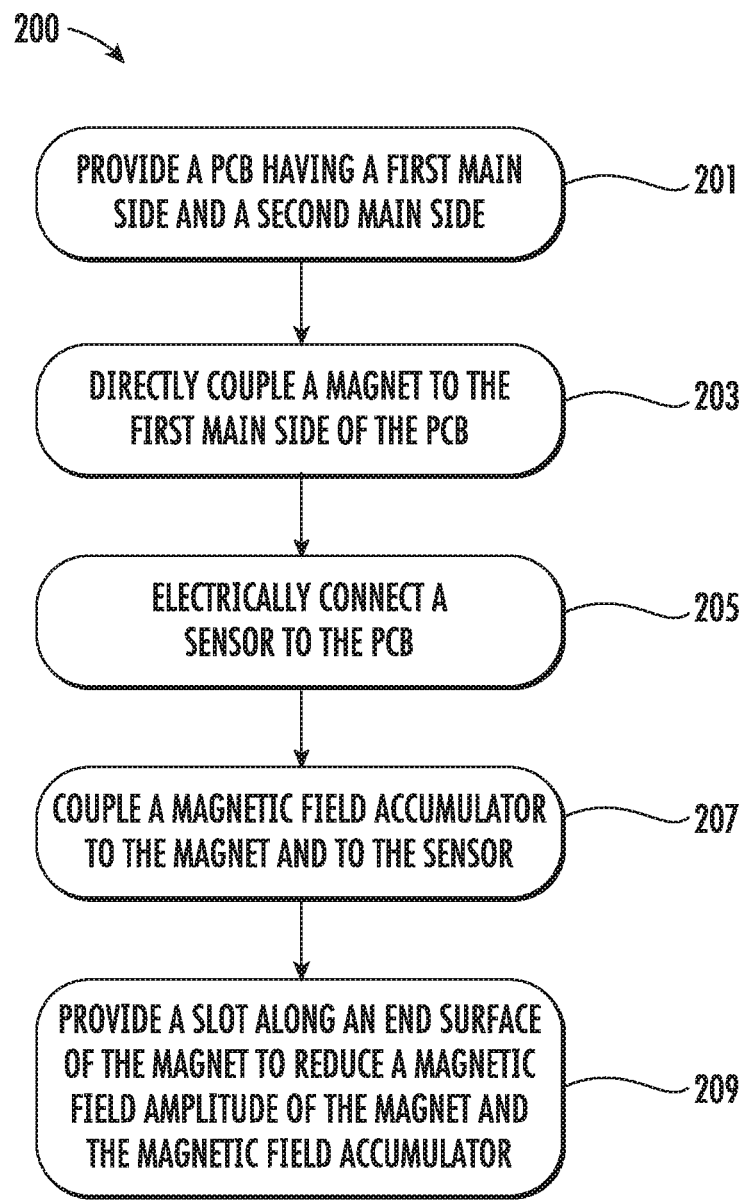
FIG. 6 is a process for reducing a magnetic field amplitude in a speed sensor assembly according to exemplary embodiments of the disclosure.

Turning now to FIG. 6, a method 200 for reducing a magnetic field amplitude in a speed sensor assembly, such as speed sensor assembly 114, according to embodiments of the present disclosure will be described in greater detail. At block 201, the method 200 may include providing a PCB having a first main side and a second main side. At block 203, the method 200 may include directly coupling a magnet to the first main side of the PCB. In some embodiments, the magnet may include a first end, a second end opposite the first end, a first side extending between the first and second sides and, and a second side opposite the first side. The first and second sides may be defined by generally flat surfaces parallel to one another. In some embodiments, the first side of the magnet is directly physically coupled to the first main side of the PCB.

At block 205, the method 200 may include electrically connecting a sensor to the PCB. In some embodiments, the sensor is a Hall effect sensor including a Hall chip. In some embodiments, the sensor may be electrically connected to the PCB by a set of wire lines, which may provide input/output therebetween.

At block 207, the method 200 may include coupling a pole piece to the magnet and to the sensor. In some embodiments, the pole piece may employ a pole-piece material such as a ferromagnetic material capable of counteracting certain magnetic fields generated from the magnet and from the target wheel. As the magnet is moved, its magnetic field distribution is changed.

At block 209, the method 200 may include providing a slot along an end surface of the magnet to reduce a magnetic field amplitude of the magnet and the pole piece. In some embodiments, the pole piece is directly coupled to the end surface of the magnet. As such, the slot is enclosed/covered by the pole piece. In some embodiments, the slot is formed between the first and second sides of the magnet. In some embodiments, the slot is recessed into the end surface of the first end of the magnet. In some embodiments, the pole piece is attached to, and oriented parallel to, a plane defined by the end surface of the magnet.

Although not shown or described herein for the sake of brevity, one of ordinary skill in the art would understand the speed sensor assembly 114 may operate with a PCBA, which includes some electrical components, a hall chip and magnet. The sensor detector may be configured to communicate with the hall chip 118, wherein the sensor is operable to sense a position and/or an intensity of the magnet 116 in proximity to the hall chip 118. The sensor detector may receive a measurement/output from the sensor of a magnetic field in proximity to the pole piece 125 coupled to the sensor, and determine a position of the magnet 116 relative to the pole piece 125 and the hall chip 118 based on the measurement of the magnetic field.

The sensor assembly 114 described herein may be positioned adjacent to a transmission gear. The transmission gear may include a plurality of teeth. Moreover, the transmission gear may be rotatably supported by a shaft. Therefore, the transmission gear may rotate. The sensor assembly 114, in some implementations, is responsive to the ferromagnetic gear teeth associated with the transmission gear. Specifically, the hall chip of the sensor assembly 114 may generate an output signal that relates to a magnetic field revealing of whether the magnetic field sensor element is over a gear tooth are gear valley. The output signal may have an associated frequency indicative of a speed of rotation of the transmission gear. Therefore, the sensor assembly 114 may detect a speed of the rotation of the transmission gear.

The use of "including," "comprising," or "having" and variations thereof herein is meant to encompass the items listed thereafter and equivalents thereof as well as additional items. Accordingly, the terms "including," "comprising," or "having" and variations thereof are open-ended expressions and can be used interchangeably herein.

The phrases "at least one", "one or more", and "and/or", as used herein, are open-ended expressions that are both conjunctive and disjunctive in operation. For example, each of the expressions "at least one of A, B and C", "at least one of A, B, or C", "one or more of A, B, and C", "one or more of A, B, or C" and "A, B, and/or C" means A alone, B alone, C alone, A and B together, A and C together, B and C together, or A, B and C together.

All directional references (e.g., proximal, distal, upper, lower, upward, downward, left, right, lateral, longitudinal, front, back, top, bottom, above, below, vertical, horizontal, radial, axial, clockwise, and counterclockwise) are only used for identification purposes to aid the reader's understanding of the present disclosure, and do not create limitations, particularly as to the position, orientation, or use of this disclosure. Connection references (e.g., attached, coupled, connected, and joined) are to be construed broadly and may include intermediate members between a collection of elements and relative movement between elements unless otherwise indicated. As such, connection references do not necessarily infer that two elements are directly connected and in fixed relation to each other.

Furthermore, identification references (e.g., primary, secondary, first, second, third, fourth, etc.) are not intended to connote importance or priority, but are used to distinguish one feature from another. The drawings are for purposes of illustration only and the dimensions, positions, order and relative sizes reflected in the drawings attached hereto may vary.

Furthermore, the terms "substantial" or "substantially," as well as the terms "approximate" or "approximately," can be used interchangeably in some embodiments, and can be described using any relative measures acceptable by one of ordinary skill in the art. For example, these terms can serve as a comparison to a reference parameter, to indicate a deviation capable of providing the intended function. Although non-limiting, the deviation from the reference parameter can be, for example, in an amount of less than 1%, less than 3%, less than 5%, less than 10%, less than 15%, less than 20%, and so on.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, the present disclosure has been described herein in the context of a particular implementation in a particular environment for a particular purpose. Those of ordinary skill in the art will recognize the usefulness is not limited thereto and the present disclosure may be beneficially implemented in any number of environments for any number of purposes. Thus, the claims set forth below are to be construed in view of the full breadth and spirit of the present disclosure as described herein.

What is claimed is:

1. A speed sensor assembly comprising:
    a printed circuit board (PCB);
    a magnet directly coupled to the PCB, the magnet comprising a first end, a second end opposite the first end, a first side extending between the first end and the second end, and a second side opposite the first side, wherein the first side and second side are flat surfaces parallel to one another;
    a sensor electrically connected to the PCB; and
    a pole piece coupled between the magnet and to the sensor, wherein the magnet includes a slot partially enclosed by the pole piece, wherein the slot is a channel recessed into an end surface of the magnet at the first end, the slot to extend between the first side and the second side;
    wherein the pole piece:
        is directly coupled to the end surface to form an upper wall of the slot; and
        is a ferromagnetic material capable of counteracting magnetic fields generated from the magnet and a target.

2. The speed sensor assembly of claim 1, wherein the pole piece is oriented parallel to a plane defined by the end surface.

3. The speed sensor assembly of claim 1, wherein the first side is directly coupled to a first main side of the PCB.

4. The speed sensor assembly of claim 1, wherein the sensor is a Hall effect sensor.

5. A speed sensor assembly comprising:
    a printed circuit board (PCB) having a first main side and a second main side;
    a magnet directly coupled to the first main side of the PCB, the magnet comprising a first end, a second end opposite the first end, a first side extending between the first end and the second end, and a second side opposite the first side, wherein the first side and second side are flat surfaces parallel to one another;
a sensor electrically connected to the PCB; and
a pole piece between the magnet and the sensor, wherein the magnet includes a slot along an end surface, the slot being a channel recessed into an end surface of the magnet at the first end, the slot to extend between the first side and the second side, and wherein the pole piece is directly coupled to the end surface to form an upper wall of the slot, the pole piece further being a ferromagnetic material capable of counteracting magnetic fields generated from the magnet and a target.

6. The speed sensor assembly of claim 5, wherein the pole piece is oriented parallel to a plane defined by the end surface.

7. The speed sensor assembly of claim 5, wherein the first side of the magnet is directly coupled to the first main side of the PCB.

8. The speed sensor assembly of claim 5, wherein the sensor is a Hall effect sensor.

9. A method of reducing a magnetic field amplitude in a speed sensor assembly, the method comprising:
providing a printed circuit board (PCB);
directly coupling a magnet to the PCB, the magnet comprising a first end, a second end opposite the first end, a first side extending between the first end and the second end, and a second side opposite the first side, wherein the first side and second side are flat surfaces parallel to one another;
electrically connecting a sensor to the PCB;
positioning a pole piece between the magnet and the sensor; and
providing a slot along an end surface of the magnet to reduce a magnetic field amplitude of magnet and the pole piece, wherein the slot is a channel recessed into an end surface of the magnet at the first end, the slot to extend between the first side and the second side, wherein the pole piece;
is directly coupled to the end surface to form an upper wall of the slot; and
is a ferromagnetic material capable of counteracting magnetic fields generated from the magnet and a target.

10. The method of claim 9, further comprising forming the slot between the first side and the second side of the magnet.

11. The method of claim 10, further comprising directly coupling the first side of the magnet to a first main side of the PCB.

12. The method of claim 9, wherein the pole piece is oriented parallel to a plane defined by the end surface.

* * * * *